PNPN SWITCH WITH $10<\frac{N_E}{N_B}<100$ SO THAT CONDUCTIVITY MODULATION RESULTS DURING TURN-OFF Original Filed June 4, 1963 2 Sheets-Sheet 1

INVENTORS:
JOSEPH MOYSON,
JAMES PETRUZELLA,
BY Urban H. Faubion
THEIR ATTORNEY.

INVENTORS:
JOSEPH MOYSON,
JAMES PETRUZELLA,
BY Urban H. Faubion
THEIR ATTORNEY.

United States Patent Office 3,354,363

Patented Nov. 21, 1967

3,354,363
PNPN SWITCH WITH $10<\frac{N_E}{N_B}<100$ SO THAT CONDUCTIVITY MODULATION RESULTS DURING TURN-OFF Joseph Moyson, Union Springs, and James Petruzella, Auburn, N.Y., assignors to General Electric Company, a corporation of New York Original application June 4, 1963, Ser. No. 285,385. Divided and this application Apr. 12, 1965, Ser. No. 447,507
3 Claims. (Cl. 317—235)

ABSTRACT OF THE DISCLOSURE

The turn off gain of a four layer PNPN gate controlled switch is enhanced by adjusting the relative impurity concentration of the emitter and adjacent intermediate region so that $$10<\frac{N_E}{N_B}<100$$

where $N_E$ and $N_B$ are the impurity concentrations of the emitter and base respectively in order to provide conductivity modulation during turn off.

This application is a division of Patent 3,242,551 issued Mar. 29, 1966, entitled, "Semiconductor Switch," which was based upon co-pending application, Ser. No. 285,385, filed June 4, 1963, and assigned to the assignee of the present invention.

This invention relates to semiconductor switches of the type which can be switched between two states of impedance, i.e., between a high impedance and a low impedance. In particular, the invention relates to such switches which can be changed from a state of low impedance to a state of high impedance and from a state of high impedance to a state of low impedance. Stated in another way, the invention relates to such semiconductor switches which can be changed from a highly conductive state to a much less conductive state (turned off) and also switched from the essentially non-conductive state to the highly conductive state (turned on).

Semiconductor switches have become an important component in a wide variety of control applications, particularly PNPN three terminal devices of the type frequently referred to as silicon controlled rectifiers. Operation of such devices is described in Chapter 1 of the General Electric Controlled Rectifier Manual, second edition, copyright 1961 by the General Electric Company, the article by Moll, Tanenbaum, Goldey and Holonyak in "Proceedings of the IRE," September 1956, volume 44, pages 1174 to 1182, and in the co-pending patent application, Ser. No. 838,504, entitled, "Semiconductor Devices and Methods of Making Same," filed Sept. 8, 1959, in the name of Nick Holonyak, Jr., and Richard W. Aldrich and assigned to the assignee of the present application. The semiconductor switch is made an active element in the circuit by connecting two of its three terminals (its anode and cathode terminals) in the circuit to be controlled. With the switch in its "off" condition the rectifier acts as a high impedance element. Except for a very small leakage current, the switch acts as an open circuit. When the switch is in its "on" condition, it is a very low impedance device.

The usual mechanism for rendering the device conductive is to introduce current into a third lead or terminal (called the gate lead) which increases the current flowing through the device and thereby renders the device conductive. This action is descriptively referred to as triggering the device or turning it on. When the device is triggered into the high conduction mode, the gate lead has very little control over the device and the only method of turning the device off is to reduce the current between the device anode and cathode (the main conduction path) below a given level called the holding current level.

These devices have been made extremely sensitive to triggering (turn on) injection current at the gate terminal. That is, they have been made so that an extremely small gate injection current can be used to change the device from its high impedance state to its high conduction mode. However, it has been extremely difficult to switch the device from its high conduction mode to the low conduction mode of operation utilizing current removal at the gate lead. It may readily be seen how useful a device would be if it could be turned off with a turn-off pulse at the gate and the present invention provides such a device.

To understand the gate turn off mechanism, it is necessary to understand a few of the operating principles and characteristics of 4 layer, 3 terminal switching elements. The operation of these devices is generally well understood. However, certain aspects of the operation of these devices is so crucial to an understanding of the present invention that a somewhat simplified physical description of the operation is given here.

The heart of the switch is generally a pellet of monocrystalline semiconductor material such as silicon which has four layers of alternate conductivity type, i.e., 4 layers which alternately have an excess of positive holes (p-type material) and an excess of negative electrons (n-type material) with a barrier or junction between the layers. Thus, the device is called a PNPN or NPNP semiconductor device to describe the four layers of alternate conduction types. One of the easiest ways to understand the operating principles is to consider a 4-layer PNPN device (see FIGURE 1A) to consist of a PNP and NPN transistor (FIGURES 1*b* and 1*c*, respectively) with the center junction $J_c$ and the two center layers common to both transistors.

It is generally recognized that a semiconductor device consisting of two layers of different conductivity types (i.e., a PN device) readily conducts current in one direction but blocks current in the opposite direction. For example, if a voltage is applied across such a PN device which is positive at the P type layer and negative at the N type layer, the device readily conducts current whereas the device blocks current flow when the reverse voltage is applied. Simply stated, the reason the device readily conducts when a voltage is applied across it which is positive at the P type layer is that the positive voltage repels P type carriers at one end of the device and the negative voltage repels the negative electrons at the other end. Thus, the P and N type conduction carriers are moved toward and across the junction. With the opposite polarity applied, i.e., the junction reverse biased, the holes and electrons are attracted away from the junction. This forms a depletion region at the junction which is relatively free of both P and N type carriers. A charge appears across the depletion region (and junction), much as in a common capacitor, which opposes current flow. This condition can be broken down and current forced through the device by raising the reverse voltage to a sufficiently high value.

Now consider the PNPN device with a positive potential at the P type end layer and a negative potential at the N type end layer in the light of this discussion. It is seen that the junctions between the two outer end layers (at both ends) tend to conduct whereas the center junction, $J_c$, between the N and P type layers tends to block current flow through the device. In other words, each of our two conceptual transistors which make up the PNPN device has one junction which tends to block current flow through the device. Like the PN device discussed above, the PNPN device can be made to conduct by raising the voltage across it to some high value which forces conduction across the center junction $J_c$. It may also be made to conduct by introducing the proper amount of current through a gate lead on one of the intermediate layers to cause a change of the charge condition across the center junction $J_c$.

The total current flowing in the PNPN structure can be pictured as the sum of currents flowing in each of the individual conceptual transistor sections. Current flow in each section depends upon having current supplied to its base by the other section. That is to say that conduction of the PNP section depends on electron current from the end N type layer to the internal N type layer (base of the PNP transistor) and conduction of the NPN section depends upon flow of hole current from the end P layer to the internal P type layer (base of the NPN transistor). Without these currents the proper charge cannot be maintained across the center junction $J_c$ to support current flow.

Conditions for the device to be conducting can be stated in terms of the current gain of the individual sections. In fact, the concept of current gain $\alpha$ in each of the transistor sections (i.e., in each part of the total PNPN structure) is so fundamental to an understanding of turn off gain that a digression is made here to explain this concept. The current gain $\alpha$ is defined as the fraction of current injected at the emitter of each of the transistors which reaches the collector of that transistor. In other words, in the conceptual PNP transistor the current gain $\alpha_{pnp}$ defines the fraction of the current through the emitter (the end P type layer which has the positive voltage applied to it) which reaches the collector (i.e., the internal P type layer which is negatively biased). Thus, $\alpha_{pnp}$ is defined by the ratio of the collector current to the emitter current and in this particular transistor section the predominant current flow is hole current. The current gain of the NPN conceptual transistor section, $\alpha_{npn}$ defines the fraction of current through the emitter (the end N type layer which is biased negatively) that reaches the collector (the internal N type region which is positively biased).

The total current of the device at the center junction $J_c$ is composed of the hole current from the end P region, the electron current from the end N region and a small leakage or thermally generated current. It is known that the device is highly conductive (on) when the sum of the current gains ($\alpha$s) of the two transistor sections is unity and off or non-conductive when the sum of the current gains in the two transistor sections is less than unity, e.g., 0.9. The current gains ($\alpha_{pnp}$ and $\alpha_{npn}$) increase as the collector to emitter voltage is increased but only slightly until the device (the normally blocking junction $J_c$) breaks down and then appreciable current flows. The current gain then increases rapidly as the emitter current is increased.

The gate lead which may be connected to the internal P type conduction layer provides a very effective way of increasing the emitter current. That is to say that the emitter current is easily increased through transistor action by introducing current, $I_g$, at the gate lead. The mechanism for switching the device from its state of high impedance to its stage of low impedance is well understood. As indicated above, it is also understood that the device may be switched from its on condition (its low impedance condition) to its off condition (its high impedance condition) by decreasing the current supplied to the base of either transistor section to such a low value that the center junction $J_c$ again becomes a blocking junction, i.e., unsaturated or reverse biased. This may be done by decreasing the voltage across the device until it can no longer support the necessary current flow.

Another mechanism for doing this is to extract current at the gate lead. This "drains" positive carriers from the internal P type base region which reduces the voltage across the emitter junction which in turn reduces the flow of negative carriers from the N type end region and effectively "starves" the junction $J_c$. The reduced flow of electrons across the junction $J_c$ into the internal N type region results in a reduced voltage across the junction which also reduces the flow of positive holes from the end P type emitter region. If the withdrawn gate current is large enough, the center junction $J_c$ returns to its normally blocking condition. This effect takes place in a very short time, e.g., a few microseconds. This latter mode of operation is not used in most PNPN semiconductor switches because the current which must be withdrawn in order to turn the device off approaches the normal conduction current of the device.

For an understanding of the way a practical gate turn off switch is built, reference is again made to the conceptual pair of transistors illustrated in FIGURES 1, 1B and 1C. Assume that the gate lead is connected to the central P type layer (base layer) of the NPN transistor (FIGURE 1C) and consider the situation when the device is conducting. A portion of the current through the device is supplied by the PNP transistor and the magnitude of this current is dependent upon its gain $\alpha_{pnp}$. If the PNP transistor section of the device supplies a current which is much greater than the current required to keep the "normally blocking center junction $J_c$" from becoming nonconductive, then it becomes very difficult to remove enough current at the gate lead to turn the device off. Actually, under these conditions the current withdrawn by the gate may not reach a sufficiently high value to turn the device off until it almost equals the device current itself. This suggests that the current gain of the PNP region should be reduced to the point that it supplies little if any more than just that current required to keep the center junction $J_c$ conductive when no gate current is flowing. This current limit requirement is met if the current gain of the device is made to approach zero.

It is well understood that the requirement for a device to turn on is that the sum of the current gains ($\alpha_{pnp}+\alpha_{npn}$) of the conceptual transistors approach unity. Thus, if the current gain of the PNP section of the device approaches zero then the current gain of the NPN section of the device should approach unity. A device which can readily be turned off results when the ratio of the current gain of the NPN transistor section to the current gain of the PNP rection is about an order of magnitude or more.

Pursuing this line of reasoning has led workers skilled in the art to suppress the current gain of one of the conceptual transistors ($\alpha_{pnp}$ in the illustrated device). There are a number of ways to achieve this result but one of the best ways to restrict current gain of a three layer device is to limit the efficiency of one of the device emitters. For example, one means of reducing emitter efficiency is to provide a shorting electrode and another is to provide an emitter with a sheet resistance which is very high in comparison to the sheet resistance of the base. The sheet resistance adjustment has resulted in extremely thin emitter layers (e.g., .001 mil). These structures and methods have various objections. For example, the shorted emitter alone, in general, does not provide a gate turn off device with all of the commercial requirements and it is generally not commercially feasible to produce structures with very thin layers since they are difficult to produce and/or reproduce and the processes involved are generally unstable. Consequently, it is an object of the present invention to provide a very simple, readily producible structure which gives high turn-off gain and a method for producing such structures.

Further, suppression of the current gain of one of the transistors by the means mentioned above generally increases the total device holding current which makes the device more difficult to turn on. It is, therefore, another object of this invention to provide semiconductor switches which can readily be switched between high and low impedance states (both ways) and a method of producing such devices.

The present invention takes advantage of the fact that the current gain of each individual conceptual transistor varies with load current; hence, the sum of current gains ($\alpha_{npn}+\alpha_{pnp}$) varies with total current through the device. The invention provides a structure wherein the sum of current gains ($\alpha_{pnp}+\alpha_{npn}$) is very nearly unity at a very low device current (e.g., 100 milliamperes or less); is very nearly unity at the peak value of device current which is to be turned off by the device gate and is at least unity for all device currents in between. Since the sum of current gains is unity at a low load current, the device holding current and, hence, turn on current is low. The fact that the sum of current gains is very near unity at the peak load current (total device current) which is to be turned off, the gate current required to switch the device to its low impedance state is relatively low and, hence, the device has a high turn off gain.

When used in this sense, turn off gain is defined as the ratio of current flowing in the load when the switch is on to the gate current required to turn the switch off. In one practical device, a load current of 600 milliamperes is turned off with an 8-milliampere gate current to provide a turn off gain of 75.

In order to insure the proper relationship of the sum of the current gains ($\alpha_{pnp}+\alpha_{npn}$) over the range of device current contemplated, the current gain of the transistor section (PNP section as illustrated) having the gate lead connected to its collector layer is tailored by controlling the thickness and the relative average impurity concentration of its emitter layer (end P type layer in FIGURE 1A) and the adjacent base layer. The mechanism which provides the desired variation of device current gain with load current is referred to as conductivity modulation.

Conductivity modulation takes place in a three-layer device (e.g., the PNP conceptual transistor) when the relative doping and thickness of layers on opposite sides of the emitting PN junction are adjusted so that as current through the device is increased the concentration of carriers in the base layer is raised by a significant amount. Since conductivity modulation causes considerable variation in emitter efficiency and hence current gain, this mechanism is used to control the current gain profile to provide the proper sum of current gains ($\alpha_{pnp}+\alpha_{npn}$).

In carrying out the present invention a four layer three leaded PNPN semiconductor switch is provided which can be turned off and turned on at a gate lead. The turn off feature is provided by depressing the current gain of one section of the device in such a manner that the sum of the current gains of the section is near unity at the peak total device current which is to be turned off. This is accomplished by reducing the efficiency of the emitter of the device (e.g., the end P type layer of FIGURE 1A) having the gate lead connected to its collector (PNP transistor of the upper part of FIGURE 1B) by selecting a base material with a rather low average impurity concentration and adjusting the ratio of the impurity concentration in the emitter layer relative to the impurity concentration in the adjacent base layer (e.g., the internal N type layer of FIGURE 1A). A preferred method of making the device includes adjusting this impurity concentration ratio by making the emitter region extra thick and providing a graded impurity concentration which is high at the external surface and diminishes inwardly so that this emitter layer has a higher average impurity concentration than desired for the final device and adjusting the emitter thickness and average impurity concentration by removing material from the outer surface of the layer.

The features which are believed to be characteristic of the invention are set forth with particularity in the appended claims. The invention itself, however, both as to its organization and advantages thereof may best be understood by reference to the following description taken in connection with the accompanying drawings in which:

Figure 1A:
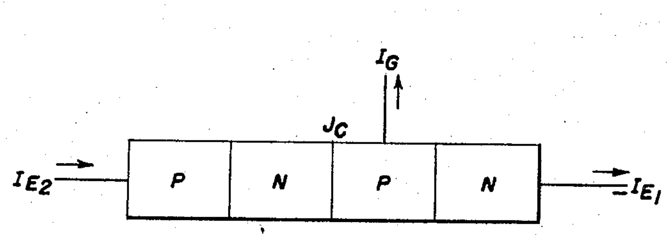
FIGURE 1A is a schematic representation of a four layer, three terminal PNPN switch used in the description and analysis of the present invention (including the above description)

In order to obtain a better understanding of the invention a simple one dimensional analysis is given utilizing the typical four region PNPN structure schematically represented in FIGURE 1A. Before beginning the analysis, however, it should be recognized that a three terminal PNPN switch cannot be described accurately by a one dimensional model, except at very low current levels. Even so, the analysis provides considerable insight into the problems involved in both turning on and turning off such switches.

As pointed out above, the four zone, three terminal PNPN switch illustrated in FIGURE 1A has contacts fixed to the two end regions and a gate lead attached to one of the base layers (the internal P region as illustrated). Assume an external voltage applied across the switch which is positive at the end P region and negative at the end N region. For this polarity the current flows through the device as indicated by the arrows from the external P type region to the external N type region. The current flowing into the external P type region is designated at $I_{E2}$, the current flowing out from the external N type region is designated as $I_{E1}$ and the current flowing in the gate lead is designated as $I_g$. As above, the current gain for the PNP region is designated as $\alpha_{pnp}$ and the current gain for the NPN region is designated as $\alpha_{npn}$. If some leakage currents are neglected, the following equations can be written to describe the currents in the turned on device:

(1) $$I_{E2}\alpha_{pnp}-I_G=(1-\alpha_{npn})I_{E1}$$

(2) $$I_{E1}\alpha_{npn}=(1-\alpha_{pnp})I_{E2}$$

solving for $I_{E2}$ the following equation is obtained:

(3) $$I_{E2}=I_G\frac{\alpha_{npn}}{\alpha_{npn}+\alpha_{pnp}-1}$$

To determine the requirements for turning off the device, the device is considered to be in the conduction state with an external current to the load flowing which is determined principally by the magnitude of the external power supply voltage and the resistance of the load connected to the device. As was indicated previously, the center junction in the device, i.e., the junction between the internal N and P regions (labeled $J_c$) is a junction which normally opposes current flow in the direction indicated. When current is flowing, a voltage appears across the junction $J_c$ which is in a direction to maintain or substain current flow through the junction. In other words, the junction voltage changes from its blocking direction in the non-conducting state to "forward bias" in its conducting state. Thus, it is apparent that the voltage across this junction varies. By this mechanism, the current in the device and the current gain ($\alpha$'s) of the two sections of the device change. Once the device is conducting, the change of the $\alpha$'s is in a direction to supply exactly enough base current for each transistor section to maintain the current flow. If the current is removed from one of the bases the load current drops unless the current gains ($\alpha$'s) can readjust (increase) themselves.

For a given load current there is a maximum value possible for each of the $\alpha$'s. As the outflow of gate current is increased, the $\alpha$ of the NPN section (the section having the gate lead attached to its base) decreases until ($\alpha_{npn}+\alpha_{pnp}$) is less than one. At this point, the device switches to the off state.

To find the gate current $I_G$ required to turn off a given load current, $I_{E2}$, the $\alpha s$ are assumed to have their maximum values (for the currents $I_{E2}$ and $I_{E1}$). We assume that $I_{E2}$ has a minimum possible value $I_M$ with the gate current $I_G$ and $I_H$ is the holding current necessary to maintain the device in its on condition where $I_G=0$. We define turn off capability $\beta_{off}$ as a ratio of change in minimum hold current to the gate current $I_E$. This parameter is sometimes called turn off gain but, as previously indicated, for the present discussion turn off gain is defined as the ratio of load current to the gate current required to turn it off. The turn off capability parameter is considered important since it expresses the change in holding current $I_H$ at different levels of load current. The following equation defines turn off capability for the device:

(4) $$\beta_{off}=\frac{I_M-I_H}{I_G}=\frac{I_M}{I_G}\left(1-\frac{I_H}{I_M}\right)$$

Then substituting from Equation 3 above turn off capability (5) $$\beta_{off}=\left(\frac{\alpha_{npn}}{\alpha_{npn}+\alpha_{pnp}-1}\right)\left(1-\frac{I_H}{I_M}\right)$$

or if $I_M$ is much larger than $I_H$ (6) $$\beta_{off}\rightarrow\frac{\alpha_{npn}}{\alpha_{npn}+\alpha_{pnp}-1}\ (I_M>>I_H)$$

It turns out that this is precisely the expression which can be arrived at for turn off gain when starting with the definition given above. This, of course, is to be expected since the turn off gain definition initially ignores holding current $I_H$ and this expression is arrived at assuming the holding current term ($I_H/I_M$) is negligible.

In general, the way that the $\alpha$'s vary as a function of current is unknown. Experiments indicate that it is possible to have both $\alpha$'s approach unity at moderate currents (as, for example, a result of fields developed by ohmic current flow). Under these conditions the turn off gain then also approaches unity. It is clear then that the turn off gain can be high if some means can be found to restrict one or both of the $\alpha$'s. For the expression above (Equation 6) it is clear that the better turn off gain is achieved if the $\alpha_{pnp}$ is restricted.

An inspection of the equation for the turn off gain (6) shows that the individual current gains $\alpha_{npn}$ and $\alpha_{pnp}$ should have a sum very nearly unity for maximum turn off gain and that the turn off gain can be high if a means is found to restrict one or both of the individual current gains ($\alpha$'s). Since the $\alpha_{npn}$ appears in the numerator (for the device structure illustrated) it becomes apparent that maximum effect will be obtained if $\alpha_{pnp}$ is the one which is suppressed. A consideration of these equations also shows that in order for a PNPN or NPNP device to exhibit a switching characteristic (from high to low impedance) the current gain ($\alpha$) of at least one section of the device must increase with current. That is to say, that since the sum of the $\alpha$'s of the section must be greater than one to exhibit turn on gain and since the sum of the $\alpha$'s must be less than unity in order to have turn off gain it is apparent that at least one component transistor structure must have an $\alpha$ which varies with current if both turn on and turn off gain are to be exhibited.

These considerations have led many skilled in the art to attempt to suppress the one current gain ($\alpha_{pnp}$) so that its maximum value is near zero (e.g., 0.1 or less) and adjust the other current gain so that it rapidly increases with load current to a value as near unity as possible. This has resulted in devices which are less than adequate in performance and difficult to produce and reproduce (for reasons discussed previously).

In order to provide a device with good turn off gain and which can readily be produced and reproduced, the one current gain ($\alpha_{pnp}$) is suppressed to a certain degree but more important, the current gain characteristic (i.e., variation of current gain with load current) is tailored so that $\alpha_{pnp}+\alpha_{npn}$ is unity at a low value of load current and very nearly unity at the maximum load current to be turned off. This is accomplished through the proper use of conductivity modulation in the conceptual transistor having the gate lead connected to its collector (i.e., the PNP device as illustrated).

Perhaps a better insight can be obtained into the means for restricting current gain and tailoring the current gain vs. load current characteristic if it is recognized that the current gain $\alpha$ is basically composed of two parameters vis: $\gamma$ the emitter efficiency and T, the transport factor. $\alpha$ is simply the product of these two quantities, that is (7) $$\alpha=\gamma_T$$

Now $\gamma$ is principally determined by the relative impurity concentration of the layers on opposite sides of junction and for not too high or too low injection levels is given by the following equation:

(8) $$\gamma=\frac{1}{1+\frac{\sigma_B W_B}{\sigma_E L_E}}$$

where $L_E$ is the diffusion length for minority carriers on the emitter side of the junction, $W_B$ is the base width, $\sigma_B$ and $\sigma_E$ are conductivities of the base and emitter regions respectively. The emitter width $W_E$ may be substituted for the diffusion length $L_E$ in the case of the present invention since emitter width will normally be less than a diffusion length.

Figure 2:
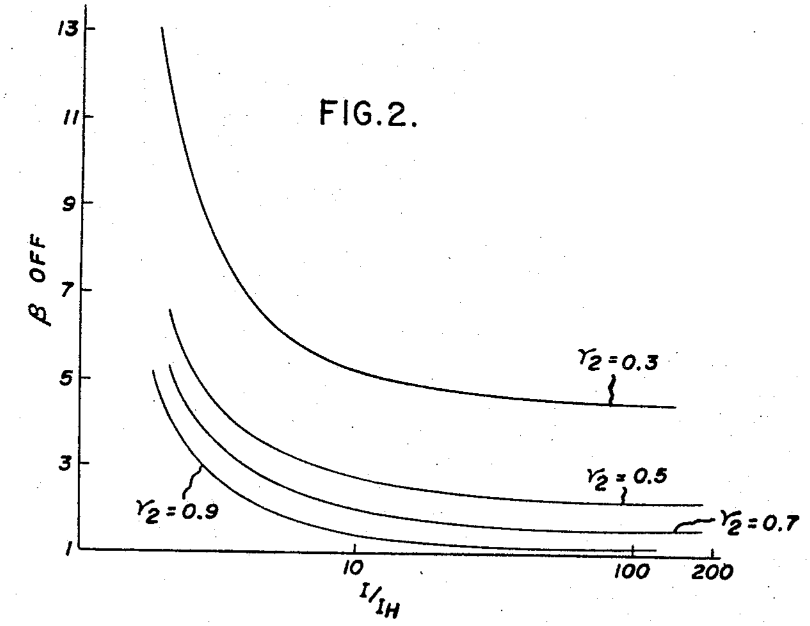
FIGURE 2 is a graph showing calculated values of turn off capability $\beta_{off}$ plotted along the axis of ordinates against the ratio of device current I to hold current $I_H$ plotted along the axis of abscissas for a number of values of emitter injection efficiency $\gamma_{E2}$.

Now consider the means of restricting and tailoring the current gain. First to the point of restricting $\alpha$. One means of restricting one of the $\alpha$'s, for example $\alpha_{pnp}$, is to make emitter efficiency $\gamma_{E2}$ of the PNP section low (consider Equation 7). A way to illustrate this effect is shown in FIGURE 2 of the drawings where a calculated value for turn off capability $\beta_{off}$ is plotted along the axis of ordinates as a function of the ratio of device current to holding current, $I/I_H$ (plotted along the axis of abscissas for several values of emitter injection efficiency $\gamma_{E2}$). For this purpose, $\alpha_{npn}$ is assumed constant at 0.9. $\alpha_{pnp}$ is assumed to have the form:

(9) $$\alpha_{pnp}=\gamma_{E2}\exp\left(-I_0/I\right)$$

where $I_0$ is the current at which the device turns off. The hold current $I_H$ as obtained for the condition $$\alpha_{npn}+\alpha_{pnp}=1$$

is

(10) $$I_H=\frac{I_0}{\ln\left(\frac{\gamma_{E2}}{1-\alpha_{npn}}\right)}$$

so that

(11) $$\alpha_{pnp}=\gamma_{E2}\exp\left[-I_H\frac{\ln\left(\frac{E2}{1-\alpha_{npn}}\right)}{1}\right]$$

Notice that the form for $\alpha_{pnp}$ is assumed. This assumption is not necessarily generally accepted but it is generally accepted that the $\alpha$ varies roughly exponentially with emitter current. The curves illustrate that for high values of injection efficiency $\gamma$, the turn off gains are low. Further, the turn off gain for a given injection efficiency decreases as the current increases but levels off at some substantially minimum value for each emitter injection efficiency.

Now to the point of tailoring the current gain—load current characteristics through conductivity modulation. From Equations 7 and 8 respectively, it is seen that the current gain is directly proportional to emitter efficiency $\gamma$ and the emitter efficiency is a function of the conductivity of both the base $\sigma_B$ and the emitter $\sigma_E$. The emitter efficiency decreases as the ratio of the base to emitter conductivity increases, and as has been previously pointed out, turn off gain increases as emitter efficiency decreases. Using these relationships the base conductivity $\sigma_B$ and conductivity ratio $\sigma_B/\sigma_E$ is adjusted by the relative doping (relative average impurity concentration) of the base and emitter layer so that the emitter efficiency at low current levels (e.g., 100 milliamperes or less) is of a proper value to produce a current gain $\alpha_{pnp}$ which makes the sum of current gains $\alpha_{pnp}+\alpha_{npn}$ very nearly unity. Thus, the device has a low value of holding current $I_H$ and turns on easily. The base conductivity $\sigma_B$ is also selected so that a significant conductivity modulation takes place in the base. The values are selected to produce a ratio of conductivities $\sigma_B/\sigma_E$ at the peak load current which makes the emitter efficiency at this level the proper magnitude to give a current gain ($\alpha_{pnp}$) which makes the current gain seem ($\alpha_{pnp}+\alpha_{npn}$) very nearly unity. In order for the conductivity modulation to take place to any significant degree the base conductivity must be low enough so that load current raises the carrier concentration in the base layer a significant amount. Raising carrier concentration reduces resistivity; hence, the name conductivity modulation.

Figure 3:
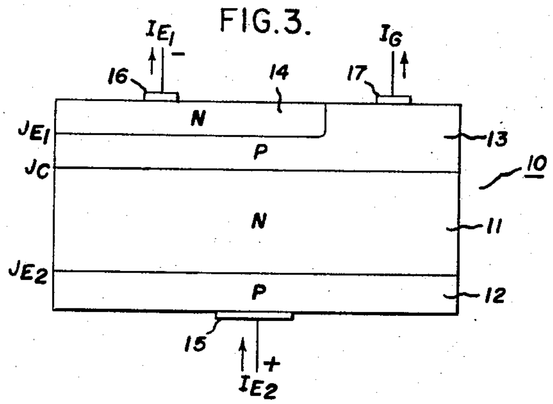
FIGURE 3 illustrates one particular embodiment of three terminal semiconductor switch which exhibits the properties of the present invention and which is constructed utilizing the preferred method of the present invention.

A practical device is illustrated somewhat schematically in FIGURE 3. As illustrated, the device includes a four layer PNPN semiconductor pellet 10, which has an internal N conductivity type base layer 11 which has P conductivity type layers 12 and 13 on opposite sides. The lower P type layer 12 is considered the lower or second emitter and the junction $J_{E2}$ between the lower P type layer 12 and internal N type layer 11 is considered the second emitter junction. The upper (internal) P type region 13 constitutes a base region which is separated from the N type base region by center junction $J_c$. An upper N conductivity type emitter layer 14 is formed in the internal P type base layer 13 and is separated therefrom by a first emitter junction $J_{E1}$.

In order to provide a working switch an ohmic contact 15 is applied on the lower major face of P type emitter region 12 to provide an anode connection, an ohmic connection is applied on the upper (opposite) major face of the pellet 10 to the upper N type emitter region 14 to provide a device cathode connection, and an ohmic contact 16 is applied to the upper (or internal) P conductivity type region 13 to provide a gate connection. The anode contact 15 and cathode contact 17 derive their names from vacuum tube terminology, that is, they are normally connected to the positive and negative voltage sources respectively. The gate contact 16 is so called because it is the medium through which the device is turned on and off.

Figure 1B:
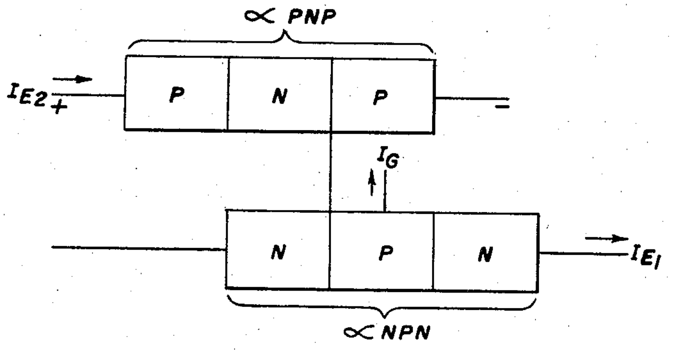
FIGURE 1B illustrates conceptual PNP upper and NPN lower transistors constructed from the four layer device of FIGURE 1A which are analyzed individually and superimposed in the above explanation of the concepts of the present invention.

It is readily seen that the four layers and three connections of the device of FIGURE 3 correspond to the four layers and three contacts of the schematic device illustrated in FIGURES 1A, 1B and 1C. Since a detailed analysis and description of principles of operation is given using the device of FIGURE 1, an analysis of operation of the device of FIGURE 3 is not given. However, the $\alpha$'s of the two transistor portions (upper three layers $\alpha_{npn}$ and lower three layers $\alpha_{pnp}$) are adjusted in accordance with the principles described. Further, the means of suppressing the current gain of the PNP section $\alpha_{pnp}$ and tailoring the current gain/load current characteristic consists of reducing the efficiency of the lower emitter 12 ($\gamma_{E2}$) and insuring a significant amount of conductivity modulation by adjusting the ratio of average impurity concentrations between the lower P type emitter 12 and the adjacent N type base layer and properly selecting the conductivity or resistivity of the base layer. It has been found that these features are provided with a base material of about 15 to 20 ohm centimeters (impurity concentration of about $2.5\times(10)^{14}$ atoms/cc. or less) and an impurity concentration ratio given by the expression $$10<\frac{N_E}{N_B}<100$$

where $N_E$ is the average impurity concentration of the emitter layer 12 in atoms per cubic centimeter, and $N_B$ is the same parameter for the base layer 11. As will be seen in connection with the description of a preferred method of making the pellet 10 (given below), this adjustment is made through the simple means of providing an impurity concentration gradient in the emitter layer 12 and adjusting the average concentration by adjusting the thickness of the emitter layer. This results in a structure that has dimensions which are eminently practical to make and reproduce with accuracy. Further, the device turn-off gain can readily be predicted and adjusted.

Figure 4:
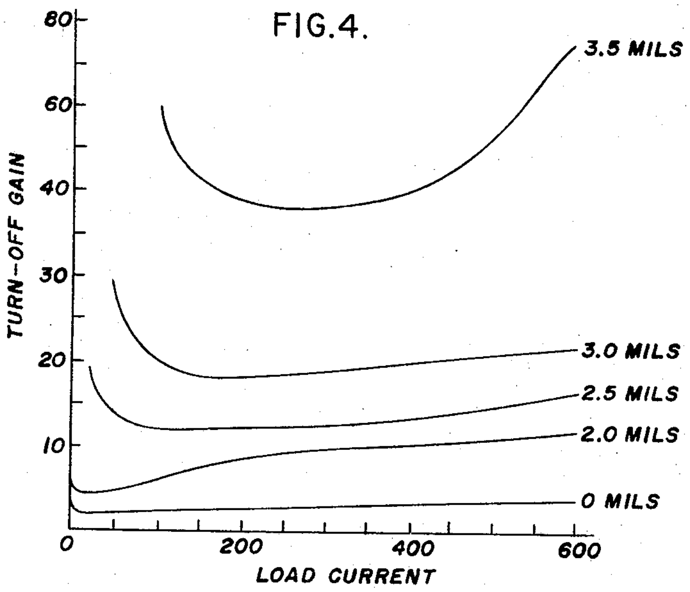
FIGURE 4 is a graph showing values of turn-off gain plotted along the axis of ordinates against the device load current plotted along the axis of abscissas for varying amounts of emitter removed from the lower emitter of the device of FIGURE 3.

Since the results illustrated in the graph of FIGURE 4 were taken using a device of the configuration illustrated in FIGURE 3 the method of fabrication and dimensions given is specifically that of the device used. Other dimensions and configurations are contemplated.

The pellet 10 is made starting with silicon of N conductivity type having a resistivity of 15 to 20 ohm-centimeters (impurity concentration of about $2.5\times(10)^{14}$ atoms/cc.) that ultimately forms the internal N type base layer 11. The initial pellet 10 has a thickness of approximately 12 miles. The pellet 10 is gallium diffused to a depth of about 2.5 to 3 mils so that P conductivity layers are formed on both sides of the N type layer 11. The P type layer on one side ultimately forms part of the lower emitter P type layer 12. The diffusion process provides a high impurity concentration at the major faces and a graded impurity concentration throughout the layer which diminishes exponentially toward the junctions. After gallium diffusion, one layer of P type material is completely removed (about 4 mils removed to make sure) by lapping or etching to leave a two-layer pellet. The pellet is again gallium diffused to form a PNP structure with an upper layer of P type conductivity of about 1 to 1.5 mils thickness and the desired impurity concentration (e.g., $1.5\times10^{18}$ atoms/cc. surface concentration). This upper layer ultimately forms the internal P type base layer 13. The second gallium diffusion step increases the width (thickness) of the lower P type layer to 3 to 5 mils and may increase the surface impurity concentration (e.g., to $5\times10^{18}$ atoms/cc.) but does not alter the fact that the impurity concentration is graded. This fact and the fact that the average impurity concentration is much higher than that which is ultimately desired to provide the desired ratio $N_E/N_B$ are both important in this method of construction of the device.

Conventional masking techniques are used to protect the pellet while a phosphorous diffusion is performed to form the upper N conductivity type emitter 14. This operation is performed in such a manner as to place the upper emitter junction $J_{E1}$ at a depth of about 0.7 mil with an impurity concentration of 1 to $2\times10^{20}$ atoms/cc. surface concentration. This operation completes the structure for pellet 10 except for reducing the thickness of the bottom P type emitter layer 12 to the thickness for the desired turn-off gain characteristics. It will be recognized that reduction of the thickness of this layer reduces its average impurity concentration (to $10^{16}$ atoms/cc. as an example) since the impurity concentration varies from a maximum at the outer major face to a minimum at the junction. With these dimensions the lower emitter efficiency $\gamma$ is reduced by a factor of three from a load current just equal to the holding current to a load current equal to the peak current to be turned off by the gate. That is, the emitter efficiency is reduced by a factor of 3 between 100 and 600 milliamperes load current.

The exact thickness of the bottom P type layer 12 is defined by the final geometry of the pellet 10, the resistivity of the original material, and the desired value of turn-off gain. These parameters are discussed in more detail in connection with the test results of FIGURE 4 but first it should be pointed out that the above description of method applies either to the final pellet 10 or to a wafer from which the final pellets may be cut by conventional means.

The data plotted in FIGURE 4 shows turn-off gain plotted as a function of device load current with each individual curve representing a different amount of P type emitter removed (amount removed is indicated on each curve) from the bottom layer 12 of the device. The curves were made utilizing a device having an upper N type emitter 14, 0.7 mil wide (deep) an internal P type base layer 13, 0.8 mil wide between the upper emitter junction $J_{E1}$ and the center junction $J_c$ and an internal N type base layer 11, 3.5 mils wide. The initial width of the lower P type emitter layer 12 is 4 mils and the final thickness( for the upper curve labeled 3.5 mils removed) is 0.5 mil. It is readily seen that all of these dimensions are eminently practical and easily constructed.

As a matter of design, the desired turn-off gain can be selected, the average impurity concentration of the base material $N_B$ is known, consequently the average impurity concentration of the lower emitter $N_E$ can then be calculated. The impurity distribution in the emitter is known so it is a simple matter to determine the amount of material to be removed from the emitter either by calculation or graphically. This method also lends itself to the experimental approach. Thus, a simple and practical device is provided which lends itself to a simple, practical method of production which can readily be repeated on a production line.

An inspection of the graph of FIGURE 4 illustrates that the turn-off gain increases with decrease in thickness of the lower P type layer 12 and that the holding current also increases with decrease in the thickness of this layer. Such a phenomena may be explained by the higher cathode emitter current density after the thickness is reduced allowing the maximum in variation of the current gain $\alpha_{pnp}$ at lower current levels. Increase in holding current may, in effect, set the lower limit for emitter width.

The attachment of the contacts 15, 16 and 17 may be done in any one of a number of conventional ways. The gate and cathode contacts 16 and 17 have been made very successfully by bonding 5-mil diameter gold wires directly to the silicon by the thermo-compression bonding at 350° C. under hydrogen coverage and by attaching 10-mil diameter aluminum wire with an ultrasonic welder. The lower emitter contact 15 has been made by flowing gold on the silicon and mounting it down to a Kovar header (not shown). Any conventional package may be used.

Figure 5:
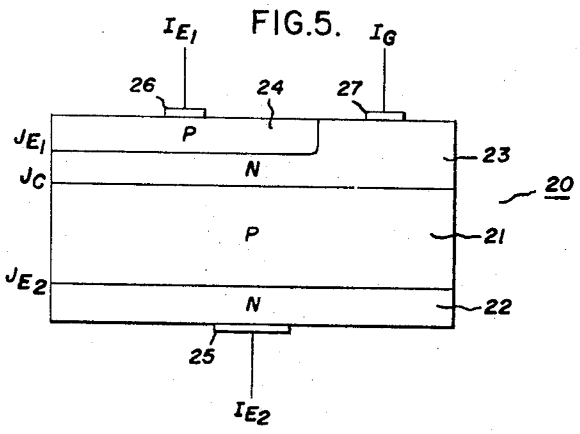
FIGURE 5 illustrates another embodiment of three terminal semiconductor switch which is the dual of the one illustrated in FIGURE 3.

The dual of the structure of FIGURE 3 is illustrated in FIGURE 5. This device may be made by similar techniques and the same general principles apply. However, to make this device, the initial wafer or pellet 20 is of P conductivity type material which ultimately forms the internal P type base region 21. The N type emitter region 22 and the internal N type base region 23 are diffused by a series of steps as described relative to region 12 and 13 of the device of FIGURE 3 but, of course, N type impurity (such as phosphorous) is used. Finally, the P type emitter 24 may be diffused in and contacts added after the thickness of the lower emitter layer 22 is adjusted. For this structure, the lower contact 25 is considered the cathode and upper emitter contact 27 is the anode.

It is obvious that the many minor modifications in means of obtaining the structure can be proposed while not departing from the present invention. For example, the internal base region to which the gate lead of either device is connected need not be formed in the initial bulk material after forming and removing one layer in this material. The initial material may be masked while the lower emitter layer is formed and then the internal base layer can be formed. Thus, while particular embodiments are illustrated and particular methods of forming these embodiments are described, the invention is not limited thereto. It is contemplated that the appended claims will cover such modifications as fall within the true spirit and scope of the invention.

What we claim as new and desire to secure by Letters Patent of the United States is:

1. A PNPN semiconductor triode switch comprising a semiconductor body including (A) a body having four layers arranged in succession
  (a) contiguous layers being of opposite conductivity type (B) low resistance connections to opposite terminal layers and to one intermediate layer, (C) means to make the effective current gain of the first three contiguous layers including the said one intermediate layer as an end layer having a very low value and means to make the effective current gain of the other three contiguous layers less than unity but much greater than said first three layers whereby the sum of said current gains approach unity, (D) the terminal layer opposite said one intermediate layer and the adjacent intermediate layer having average impurity concentrations $N_E$ and $N_B$ respectively such that $$10<\frac{N_E}{N_B}<100$$

where $N_E$ is between $10^{15}$ and $10^{17}$ atoms/cc.

2. A PNPN semiconductor triode switch comprising a semiconductor body including (A) a body having four layers arranged in succession,
  (a) contiguous layers being of opposite conductivity type (B) low resistance connections to one terminal layer and to the adjacent intermediate layer, (C) a low resistance connection to said opposite terminal layer, (D) means to make the effective current gain of a first three contiguous layers including the contacted intermediate layer as one end layer and the said opposite terminal layer as the other end layer have a very low value and means to make the effective current gain of the other three contiguous layers less than unity but near an order of magnitude greater than said first three layers whereby the sum of said current gains approach unity, (E) the said opposite end layer and the adjacent intermediate layer having average impurity concentrations whereby the ratio of the average impurity concentrations of said opposite end layer to that of said adjacent intermediate layer is between 10 and 100 in magnitude the average impurity concentration of the opposite end layer is between $10^{15}$ and $10^{17}$ atoms/cc.

3. In combination in a semiconductor switch (A) a body of semiconductor material having four layers of alternate conductivity type separated by three junctions, (B) low resistance connections to each terminal layer and one of said intermediate layers, (C) the said terminal layer opposite the contacted intermediate layer having (a) a graded impurity concentration which diminishes from its outer surface toward the next intermediate layer and (b) having a thickness to provide an average impurity concentiation between $10^{15}$ and $10^{17}$ atoms/cc., and a ratio of average impurity concentration to average impurity concentration of said next adjacent intermediate layer of between 10 and 100.

References Cited

UNITED STATES PATENTS

| | | | |
|---|---|---|---|
| 2,869,084 | 1/1959 | Shockley | 33—80 |
| 3,083,302 | 3/1963 | Rutz | 307—88.5 |
| 3,193,737 | 6/1965 | Swanson | 317—234 |
| 3,201,596 | 8/1965 | Longini | 307—88.5 |
| 3,202,832 | 8/1965 | De Wolf | 307—88.5 |
| 3,210,563 | 10/1965 | New | 307—88.5 |
| 3,231,796 | 1/1966 | Shombert | 317—235 |
| 3,239,728 | 3/1966 | Aldrich et al. | 317—235 |

JOHN W. HUCKERT, *Primary Examiner.*

M. EDLOW, *Assistant Examiner.*